US008947122B2

(12) United States Patent
Prabhakar

(10) Patent No.: US 8,947,122 B2
(45) Date of Patent: Feb. 3, 2015

(54) NON-VOLATILE LATCH STRUCTURES WITH SMALL AREA FOR FPGA

(71) Applicant: Cypress Semiconductor Corporation, San Jose, CA (US)

(72) Inventor: Venkatraman Prabhakar, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/827,607

(22) Filed: Mar. 14, 2013

(65) Prior Publication Data

US 2014/0197864 A1    Jul. 17, 2014

Related U.S. Application Data

(60) Provisional application No. 61/752,248, filed on Jan. 14, 2013.

(51) Int. Cl.
*H03K 19/0944* (2006.01)

(52) U.S. Cl.
CPC .................................. *H03K 19/0944* (2013.01)
USPC ........................................ 326/46; 365/185.07

(58) Field of Classification Search
None
See application file for complete search history.

(56) References Cited

U.S. PATENT DOCUMENTS

| 4,527,255 | A | * | 7/1985 | Keshtbod | 365/154 |
|---|---|---|---|---|---|
| 4,541,073 | A | * | 9/1985 | Brice et al. | 365/185.07 |
| 4,980,859 | A | * | 12/1990 | Guterman et al. | 365/185.08 |
| 5,065,362 | A | * | 11/1991 | Herdt et al. | 365/154 |
| 5,496,756 | A | | 3/1996 | Sharma et al. | |
| 5,790,452 | A | | 8/1998 | Lien | |
| 5,798,547 | A | * | 8/1998 | Urai | 257/316 |
| 6,097,629 | A | * | 8/2000 | Dietrich et al. | 365/185.07 |
| 6,144,580 | A | | 11/2000 | Murray | |
| 6,414,873 | B1 | * | 7/2002 | Herdt | 365/185.08 |
| 6,606,045 | B2 | * | 8/2003 | Azami et al. | 341/144 |
| 6,639,840 | B1 | | 10/2003 | Rapp et al. | |
| 6,998,309 | B2 | | 2/2006 | Cho et al. | |
| 7,369,438 | B2 | * | 5/2008 | Lee | 365/185.17 |
| 7,385,857 | B2 | * | 6/2008 | Dalton | 365/185.29 |
| 7,505,303 | B2 | * | 3/2009 | Ashokkumar et al. | 365/154 |
| 7,539,054 | B2 | * | 5/2009 | Ashokkumar et al. | 365/185.07 |
| 7,710,776 | B2 | * | 5/2010 | Johal et al. | 365/185.08 |
| 7,760,540 | B2 | * | 7/2010 | Still | 365/154 |
| 7,957,192 | B2 | | 6/2011 | Scade et al. | |

(Continued)

OTHER PUBLICATIONS

Choi et al., Investigation of Gate-Induced Drain Leakage (GIDL) Current in Thin Body Devices: Single Gate Ultra-Thin Body, Symmetrical Double-Gate, and Asymmetrical Double-Gate MOSFETs, Jpn. J. Appl. Phys., Apr. 2003, pp. 2073-2076, vol. 42, Part I, No. 4B.

(Continued)

*Primary Examiner* — Crystal L Hammond

(57) ABSTRACT

A latch circuit and method includes providing a first tri-gate non-volatile device, providing a second tri-gate non-volatile device, coupling the first tri-gate non-volatile device to the second tri-gate non-volatile device, erasing the first tri-gate non-volatile device, programming the second tri-gate non-volatile device, and latching an output node of the latch device to a logic state determined by respective thresholds of the first and second tri-gate non-volatile devices. Coupling the first tri-gate non-volatile device to the second tri-gate non-volatile device can include direct coupling, or indirect coupling through a cross-coupled circuit.

20 Claims, 4 Drawing Sheets

(56) References Cited

U.S. PATENT DOCUMENTS

| | | |
|---|---|---|
| 7,964,459 B2 | 6/2011 | Lusky et al. |
| 8,222,111 B1 | 7/2012 | Hwang |
| 8,315,096 B2 | 11/2012 | Allan et al. |
| 8,324,052 B2 | 12/2012 | Oh et al. |
| 8,331,134 B2 * | 12/2012 | Chiu et al. ............ 365/154 |
| 2003/0062545 A1 * | 4/2003 | Yamazaki et al. ............ 257/200 |
| 2004/0185609 A1 | 9/2004 | Okumura et al. |
| 2007/0218635 A1 * | 9/2007 | Seliskar ............ 438/268 |
| 2008/0013377 A1 | 1/2008 | Sel et al. |
| 2008/0043516 A1 | 2/2008 | Dalton |
| 2008/0151654 A1 * | 6/2008 | Allan et al. ............ 365/189.16 |
| 2008/0212373 A1 | 9/2008 | Hasegawa et al. |
| 2008/0237745 A1 | 10/2008 | Yang et al. |
| 2009/0027964 A1 | 1/2009 | Arai |
| 2009/0168513 A1 | 7/2009 | Tanaka |
| 2009/0190402 A1 | 7/2009 | Hsu et al. |
| 2012/0205734 A1 | 8/2012 | Horch |
| 2013/0182495 A1 * | 7/2013 | Deng ............ 365/156 |
| 2014/0264552 A1 | 9/2014 | Prabhakar et al. |

OTHER PUBLICATIONS

USPTO Advisory Action for U.S. Appl. No. 13/795,036 dated Feb. 26, 2014; 3 pages.
USPTO Final Rejection for U.S. Appl. No. 13/795,036 dated Nov. 15, 2013; 7 pages.
USPTO Non Final Rejection for U.S. Appl. No. 13/795,036 dated Apr. 4, 2014; 7 pages.
USPTO Non-Final Rejection for U.S. Appl. No. 13/795,036 dated Aug. 22, 2013; 6 pages.
USPTO Requirement for Restriction for U.S. Appl. No. 13/795,036 dated Jul. 10, 2013; 4 pages.
USPTO Notice of Allowance for U.S. Appl. No. 13/795,036 dated Jun. 6, 2014; 7 pages.

* cited by examiner

NON-VOLATILE LATCH STRUCTURES WITH SMALL AREA FOR FPGA

CROSS-REFERENCE TO RELATED APPLICATION

This application claims the benefit of U.S. Provisional Application Ser. No. 61/752,248 filed Jan. 14, 2013, the entire contents of which are incorporated by reference herein.

TECHNICAL FIELD

The present disclosure is related to non-volatile latch cells, and more specifically, to non-volatile latch cells using SONOS (Silicon Oxide, Nitride, Oxide, Silicon) devices.

BACKGROUND

Non-volatile latch cells are known in the art and can be used in various programmable circuits, for example, to program logic circuits or I/O circuits into different modes, or to store trim settings for analog circuits, among many other uses.

Some non-volatile latch circuits can include numerous transistors with a corresponding large layout area (~100 μm2), and require complicated signals to power-up correctly.

A SONOS non-volatile latch 100 is shown in FIG. 1. Latch 100 uses a trigate structure including one SONOS transistor (the non-volatile element) and two MOS transistors (used to isolate the SONOS transistor for programming and erasing modes) known as the STR (Store) transistor and the RCL (Recall) transistor. The SONOS transistor is a type of charge trapping transistor where charge stored in a nitride layer makes a non-volatile memory device/transistor.

In a lower portion of the circuit, latch 100 uses a first SONOS device including MOS transistors T5 and T3, and SONOS transistor T1, and a second SONOS device including MOS transistors T6 and T4, and SONOS transistor T2. The Vneg and Vspw voltages shown next to various transistors in FIG. 1 are substrate voltages of the transistors. The gates of transistors T5 and T6 are coupled together to receive the LOAD signal, the gate of transistor T1 receives the TEST_P signal, the gate of transistor T2 receives the TEST_N signal, and the gates of transistors T3 and T4 receives the PROGRAM_L signal. The sources of transistors T3 and T4 are to receive the Vspw voltage. In latch 100, transistor T1 is erased, and transistor T2 is programmed. The lower portion of latch 100 is coupled to an upper circuit portion including P-channel transistors T11, T12, T13, and T14, as well as N-channel transistors T7, T8, T9, and T10. Vltch is the substrate voltage of the PMOS devices T11, T12, T13, and T14. The sources of transistors T11, T12, T13, and T14 receive the Vpwr voltage. The gates of transistors T13 and T14 receive the EQUALIZE signal, the gate of transistor T11 is coupled to the drain of transistor T13, the gate of transistor T12 is coupled to the drain of transistor T14, the gates of transistors T9 and T10 receive the HOLD signal, the gate of transistor T7 is coupled to the drain of transistor T13, and the gate of transistor T8 is coupled to the drain of transistor T14. The sources of transistor T7 and T8 receive the Vneg voltage. Node ID is coupled to capacitor CID, and NODE IDM is coupled to capacitor CIDM. These capacitors are parasitic capacitors and input capacitors of the other circuits connected to the latch.

Latch 100 uses fourteen transistors, consumes a great deal of integrated circuit area, and relies on complicated signals. The EQUALIZE_L, LOAD, HOLD, SB, and SA signals are shown in the corresponding timing diagram of FIG. 2, as well as the equalize, delay, and latch modes of operation. Latch 100 also has a possible undesirable mode of operation. If node voltages ID and IDM have not turned on transistors T11 and T12 before the hold signal turns on, then the mismatch of the threshold voltages of transistors T9 and T10, instead of the programming and erasing of transistors T1 and T2, will determine the logic state of latch 100.

SUMMARY

According to a first embodiment, a latch circuit includes a first non-volatile tri-gate device coupled between a source of supply voltage and an output node, and a second non-volatile tri-gate device coupled between the output node and ground. The first non-volatile tri-gate device includes first and second MOS transistors, and a third transistor including a charge-trapping nitride layer. The third transistor is coupled between the first and second transistors, and each transistor shares a common current path. The second non-volatile tri-gate device includes first and second MOS transistors, and a third transistor including a charge-trapping nitride layer. The third transistor is coupled between the first and second transistors, and each transistor shares a common current path. The first tri-gate device and the second tri-gate device each include two control gates and a programming gate.

According to a second embodiment, a latch circuit includes a first non-volatile tri-gate device coupled between a first node and a bit line, a second non-volatile tri-gate device coupled between a second node and source line, and a cross-coupled circuit coupled to a source of supply voltage and to the first and second nodes. The first non-volatile tri-gate device includes first and second MOS transistors, and a third transistor including a charge-trapping nitride layer. The third transistor is coupled between the first and second transistors, and each transistor shares a common current path. The second non-volatile tri-gate device includes first and second MOS transistors, and a third transistor including a charge-trapping nitride layer. The third transistor is coupled between the first and second transistors, and each transistor shares a common current path. A first gate of the first tri-gate device and a first gate of the second tri-gate device are coupled together to a first control node, a second gate of the first tri-gate device and a second gate of the second tri-gate device are coupled together to a programming node, and a third gate of the first tri-gate device and a third gate of the second tri-gate device are coupled together to a second control node. The cross-coupled circuit includes first and second cross-coupled P-channel MOS transistors. The latch circuit also includes a buffer circuit coupled between the second node and an output node.

In one embodiment, a method of operating a latch circuit includes providing a first tri-gate non-volatile device, providing a second tri-gate non-volatile device, coupling the first tri-gate non-volatile device to the second tri-gate non-volatile device, erasing the first tri-gate non-volatile device, programming the second tri-gate non-volatile device, and latching an output node of the latch device to a logic state determined by respective thresholds of the first and second tri-gate non-volatile devices. Coupling the first tri-gate non-volatile device to the second tri-gate non-volatile device can include direct coupling, or indirect coupling through a cross-coupled circuit.

Alternative embodiments are possible where the transistor with the nitride charge trapping layer in the trigate is replaced with a floating gate transistor. In such alternative embodiments, the trigate would include two MOS transistors and a third transistor with a floating gate layer.

BRIEF DESCRIPTION OF THE DRAWINGS

The accompanying drawings, which are incorporated in and constitute a part of this specification, illustrate various embodiments of the invention and together with the description, serve to explain the principles thereto, the figures including.

DETAILED DESCRIPTION

In the following description, for purposes of explanation, numerous specific details are set forth in order to provide a thorough understanding of various embodiments of the invention. It will be evident, however, to one skilled in the art that the present invention may be practiced without these specific details. Although various latch embodiments are described herein using SONOS devices, one skilled in the art would recognize there are embodiments that may be equally well be used with floating gate or other NVM devices. Therefore, SONOS is used by way of example and not by limitation.

Figure 1:
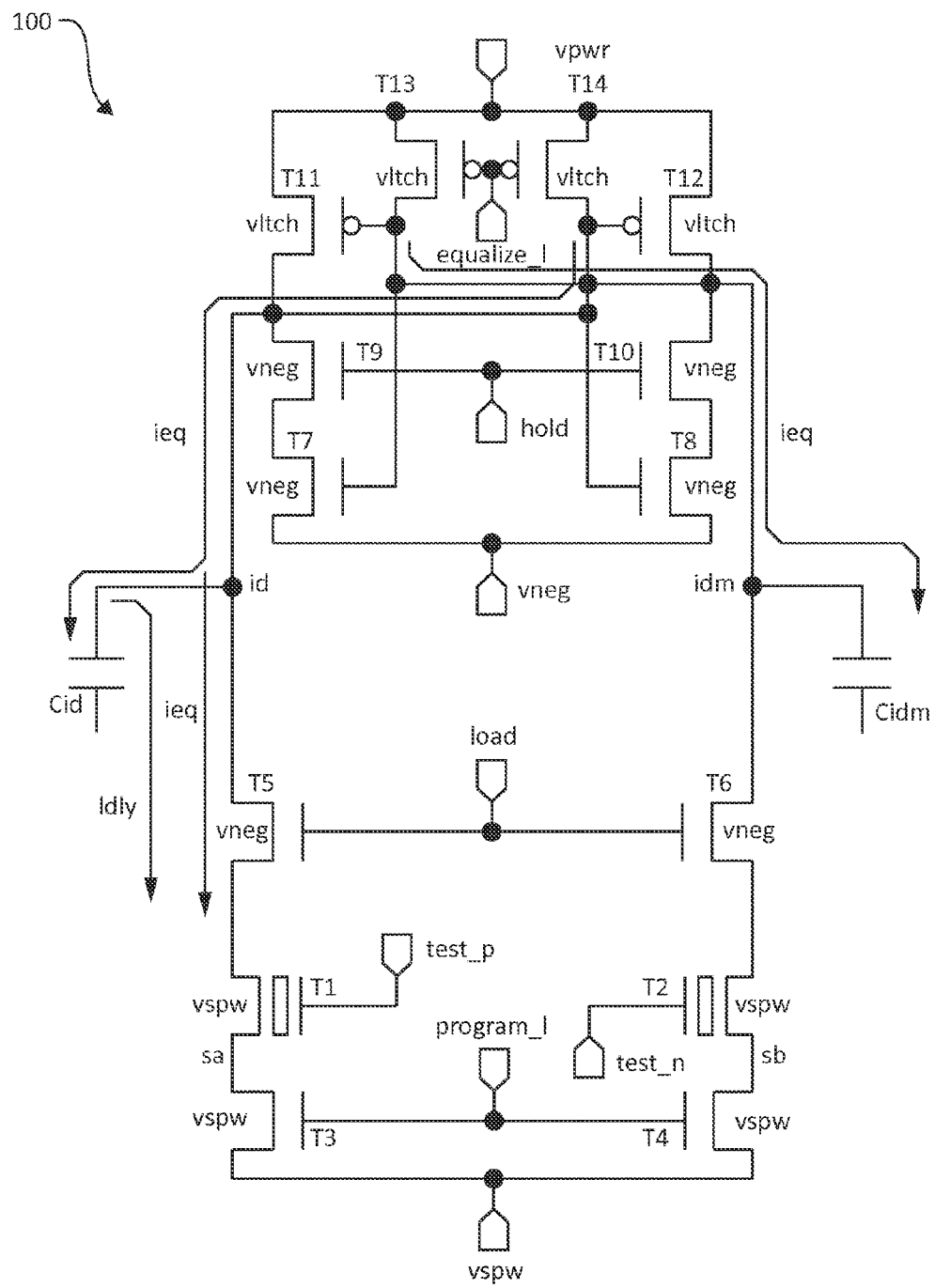
FIG. 1 is related art pertaining to a non-volatile latch circuit.
Figure 3:
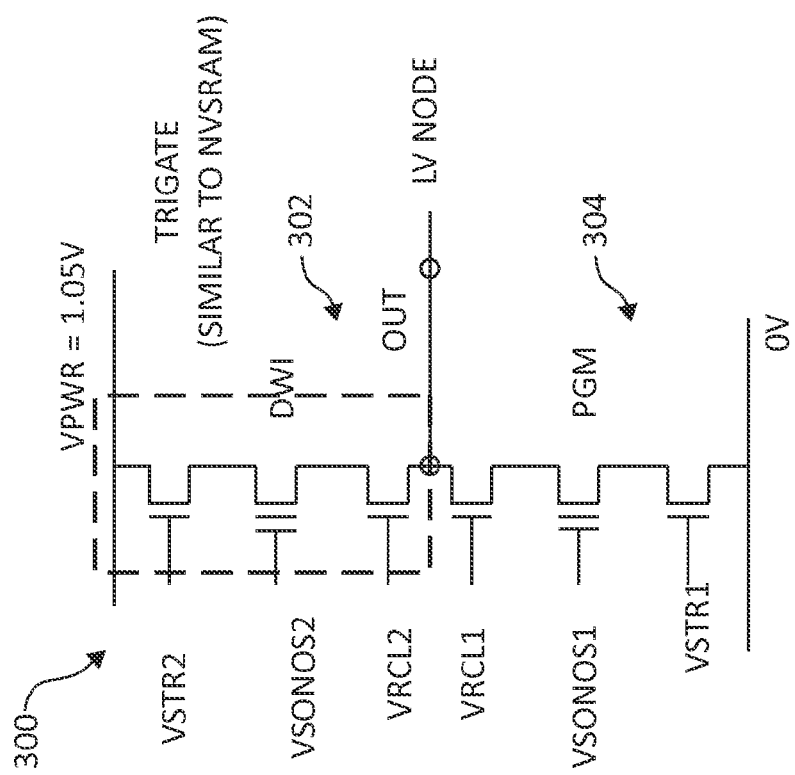
FIG. 3 is a non-volatile latch circuit 300 according to a first embodiment.
Figure 2:
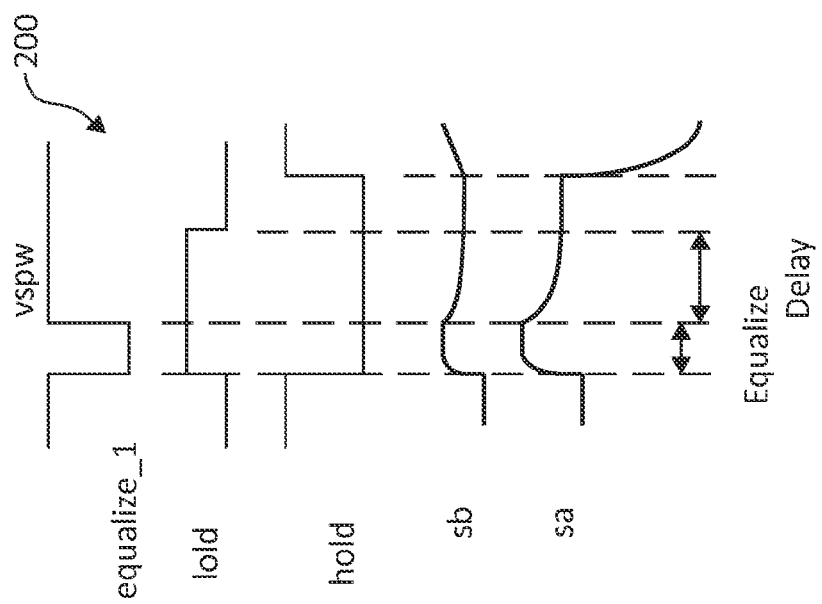
FIG. 2 is a timing diagram associated with the latch circuit of FIG. 1.

A non-volatile latch circuit 300 is shown in FIG. 3 according to one embodiment. Two tri-gate devices 302 and 304 are directly coupled together at the OUT output node. Devices 302 and 304 share a common current path. In the example shown in FIG. 3, device 302 is erased (DWI—Dynamic Write Inhibit) and device 304 is programmed (PGM). Depending upon the desired latched output logic state, the programming and erase modes may be switched. Device 302 is coupled between the VPWR power supply and the OUT output node, and device 304 is coupled between the OUT output node and ground. Except for the trigate devices, all other devices in a circuit using that latch can be low voltage devices having a reduced layout area. In addition, the use of low voltage devices enables the circuits using the latch to be faster and have larger current driving capability.

In non-volatile latch circuit 300, each device 302 and 304 has three gates coupled to three transistors. The first gate in device 302 receives the VSTR2 store signal for controlling an MOS transistor, the second gate in device 302 receives the VSONOS2 programming voltage for controlling a SONOS charge trapping transistor, and the third gate in device 302 receives the VRCL2 recall signal for controlling another MOS transistor. Similarly, the first gate in device 304 receives the VRCL1 store signal for controlling an MOS transistor, the second gate in device 304 recives the VSONOS1 programming voltage for controlling a SONOS charge trapping transistor, and the third gate in device 304 receives the VSTR1 recall signal for controlling an MOS transistor.

In general, non-volatile latch circuit 300 requires a higher window (i.e. the difference between erased and programmed threshold voltages) compared to the requirements of non-volatile latch circuit 400 described in detail below. A typical value of the window (difference between erased and programmed threshold voltages of the SONOS charge trapping transistors) is 1.6V. This voltage may be achieved with longer program/erase times for the SONOS charge trapping transistors. The layout area for the non-volatile latch circuit 300 can be further shrunk based on specific technology and design rules such as gate to gate design rules. Since there are three gates (for the two CMOS transistors and the nitride charge trap transistor), the layout area of the non-volatile latch circuit 300 can be improved by improving gate to gate design rules. It is important to note that the VPWR voltage of 1.05 volts, and the other voltages mentioned, as well as the programming voltages and other voltages mentioned below can be changed as desired for a specific implementation. These voltages are therefore not limited to the typical voltages described herein.

The non-volatile latch circuit 300 operation modes (typical voltages on certain advanced technologies such as 28 nm) are set forth below. The P-well including the non-volatile latch circuit 300 is set to zero volts in all cases. VPWR can be 1 V or 1.05V for 28 nm technology (but can be different on other technologies).

TABLE 1

|             | VSTR1       | VRCL1       | VSONOS1     | VRCL2       | VSONOS2         | VSTR2       |
|-------------|-------------|-------------|-------------|-------------|-----------------|-------------|
| Erase       | 0 V         | 0 V         | −7.5 V      | 0 V         | −7.5 V          | 0 V         |
| Program/DWI | 1 V         | 0 V         | 7.5 V       | 0 V         | 7.5 V           | 1 V         |
| Read        | 2.5 V/1.8 V | 2.5 V/1.8 V | 0 V         | 2.5 V/1.8 V | Vpwr = 1/1.05 V | 2.5 V/1.8 V |

The above Table 1 shows the voltages used to program VSONOS1 and leave the VSONOS2 in an erased state. VSONOS2 is set to a DWI (dynamic write inhibit) disturb (since Vpwr is approximately 1V) while VSONOS1 is being programmed (since the 0V from GND is passed by the VSTR1 transistor). The output node of non-volatile latch circuit 300 is referenced in FIG. 3 as the LV NODE, which is a low voltage and can be directly connected to other circuitry (e.g. 1V device in 28 nm) without any HV buffers. The LV node is isolated from the high voltages by the STR and RCL transistors.

Referring again to FIG. 3, it should be noted that the read conditions are such that SONOS1 and SONOS2 are free of read disturb issues due to the bias conditions chosen, since VSONOS1 is at 0V (same as the channel for SONOS1) during read and VSONOS2 is at Vpwr (same as the channel for SONOS2) during read. In addition, DIBL/leakage (Drain-Induced Barrier Lowering) of a programmed cell (such as non-volatile latch circuit 300) is lower since Vds is approximately equal to 1V and not 1.8V or higher.

Non-volatile latch circuit 300 (as well as non-volatile latch circuit 400 described in further detail below) can be used for UDB (Universal Digital Block) or LUT (look-up-table) based FPGAs as well as more conventional functions like storing trim bits for analog or digital circuits. Other applications for non-volatile latch circuits are also known to those skilled in the art.

Figure 4:
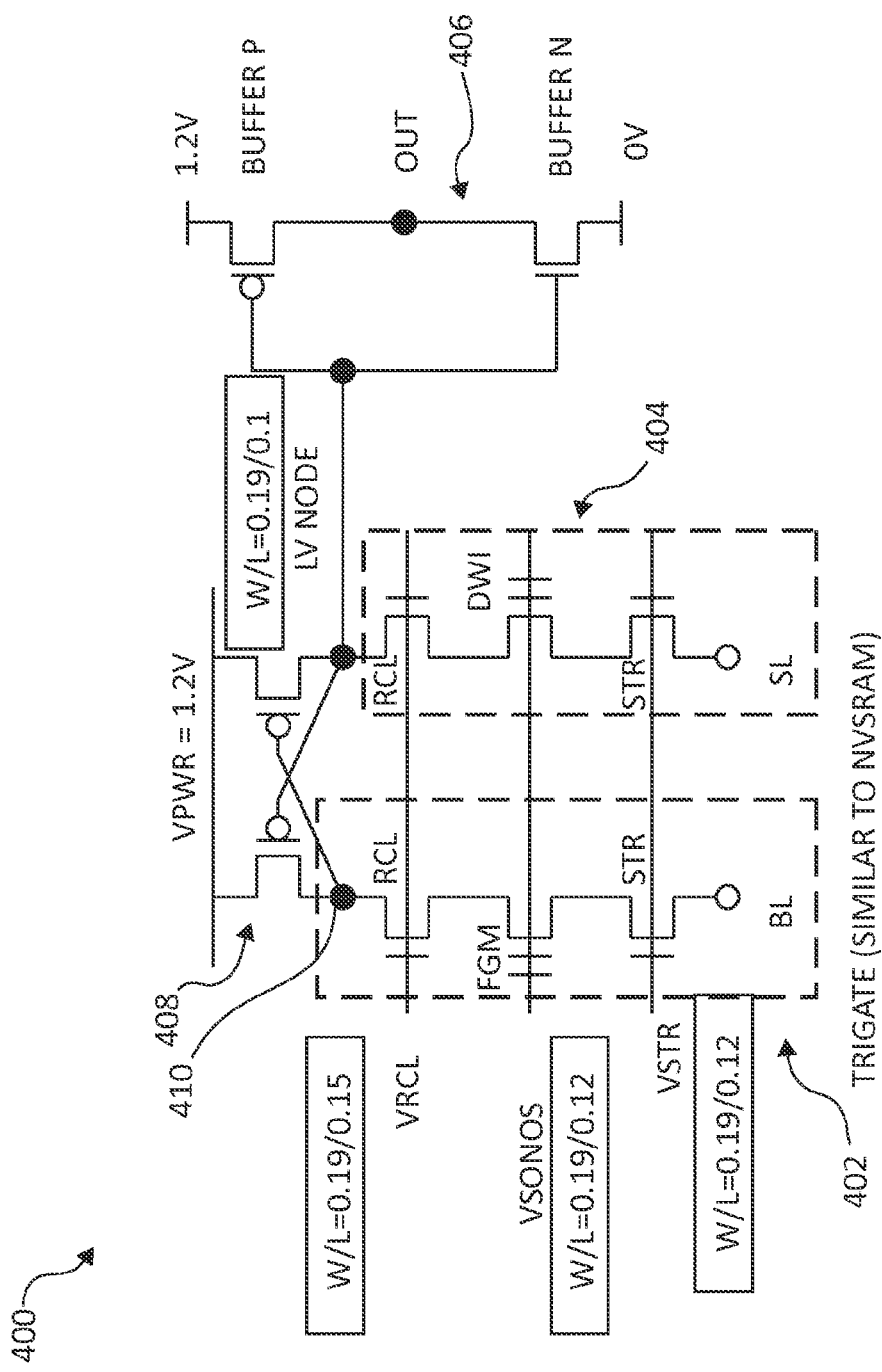
FIG. 4 is a non-volatile latch circuit 400 according to a second embodiment.

A second embodiment is the non-volatile latch circuit 400 shown in FIG. 4. Non-volatile latch circuit 400 includes a first, programmed, tri-gate device 402, and a second, erased, tri-gate device 404, coupled together with a cross-coupled PMOS transistor circuit 408. The PMOS devices in circuit 408 are weak devices to ensure robustness of the latch. Except for the tri-gate devices 402 and 404 all other devices in latch 400 can be low voltage devices (Area=3.08 µm² on 65 nm including buffer 406).

The non-volatile latch 400 has two tri-gate devices, as discussed above. One tri-gate device 402 is programmed PGM (OFF) and the other device 404 will be erased with DWI (Dynamic Write Inhibit), which will make it ON. As discussed above, there are two PMOS devices 408 cross-coupled to first and second latch nodes complete the latch. Similar to the NVSRAM, the SONOS devices are isolated by HVNMOS transistors (known as STR and RCL transistors). The PMOS devices are intentionally made weak (~10 µA), so that the SONOS current (~3 µA for 6σ cell at end-of-life (EOL)) can overcome the mismatch of the PMOS devices. The PMOS devices are made weak by making them HV devices with small W/L as well as using the LV implants to make the Vt high.

The gates of the RCL transistors (one each in device 402 and device 404) are coupled together to receive the VRCL control signal. The gates of the SONOS transistors (one each in device 402 and device 404) are coupled together to receive the VSONOS programming voltage. The gates of the STR transistors (one each in device 402 and device 404) are coupled together to receive the VSTR control signal. The first tri-gate device 402 is coupled between a first circuit node and a BL bit line node. The second tri-gate device 404 is coupled between a second circuit node 410 and a SL source line node. The cross-coupled circuit 408 is coupled between the VPWR power supply voltage and the first and second circuit nodes. A buffer 406 including a PMOS and an NMOS device has an input coupled to the second circuit node and the OUT output node.

In an operational mode of non-volatile latch circuit 400, during power up and normal chip operation (READ), BL and SL are ideally at zero volts (GND) without relying on any other part of the chip being powered up. As Vpwr reaches approximately 0.8V (Vt of PMOS devices), the erased SONOS leg will pull down the LV node (at least enough to overcome mismatch of PMOS devices) which will enable the latch to flip to the desired state. Since power up is relatively slow (at least 100 ns can be specified), the mismatched capacitive load due to the buffer only on one side is expected not to make a difference to cell robustness.

The operation table for the NV latch circuit 400, including example values is shown below in Table 2:

TABLE 2

| Signal | Read | Program/DWI | Erase |
|---|---|---|---|
| VSONOS | 0 V | 0 → 7.5 V | 0 → −7.5 V |
| VSTR | Vpwr (0 → 1.2 V) | 1.2 V | 1.2 V |
| VRCL | Vpwr (0 → 1.2 V) | 0 V | 0 V |
| BL | 0 V | 0 V (PGM) | 0 V |
| SL | 0 V | 1.2 V (DWI) | 0 V |
| Vpwr | Vpwr (0 → 1.2 V) | 1.2 V | 1.2 V |
| PWELL | 0 V | 0 V | 0 V |

The Vprw value (1.2V) in Table 2 is typical for advanced technologies (e.g. 65 nm) and non-volatile latch circuit 400 is not limited to specific values of Vpwr, or programming/erasing voltages, which will vary depending upon the specific technology, as is known to a person of ordinary skill in the art.

Figure 5:
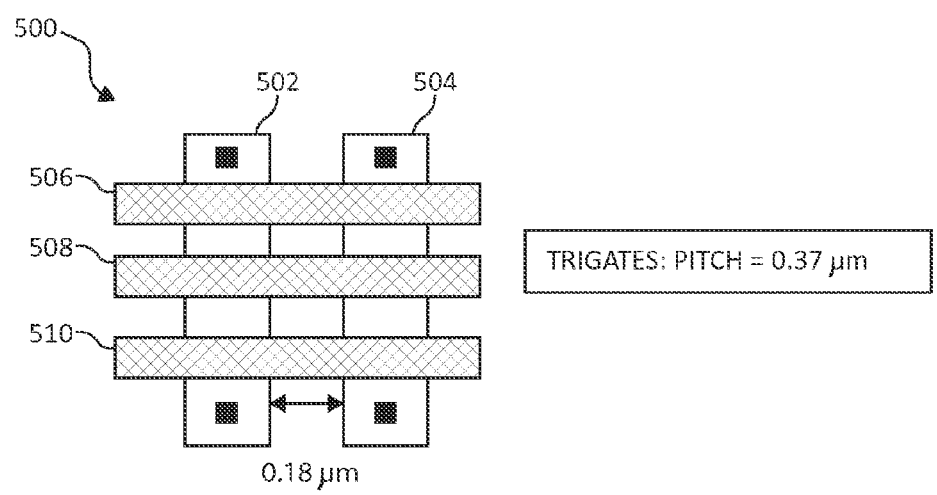
FIG. 5 is an embodiment of a layout of two tri-gate SONOS devices suitable for use in the non-volatile latch circuit 400 of FIG. 4.

A representative tri-gate layout drawing is shown in FIG. 5 for reference only, as many other layouts may be possible. For example, the active pitch (active region width and space) may be different on the specific technology used. A first source/drain diffusion 502 associated with device 402 is shown, as well as a second source/drain diffusion 504 associated with device 404. The three gates 506, 508, and 510 corresponding to the RCL, SONOS, and STR gates are also shown in FIG. 5. The tri-gate pitch and dimensions shown in FIG. 5 are for example only on a specific technology and are not limiting. The NV latch circuit 400 of the second embodiment has an area of about 3.081 µm² (including buffers) using 65 nm design rules.

Non-volatile latch circuit 400 can power up with external unregulated Vpwr=1.2V (+/−10%). This can work for a wide range of Vpwr rise times (from e.g. 100 ns to 10 ms). Non-volatile latch circuit 400 operates with the 1.2V core power supply (which may be different at different technology nodes) and not the 2.5V/3.3V I/O voltages.

Using non-volatile latch circuit 300 or 400, UDB could go into sleep/hibernate to reduce leakage to ~0.1 pA/cell and turn back on when needed within ~200 ns. For example, this could be used at the standard cell phone frequency of 32 kHz to reduce to the duty cycle/leakage power to ~3% (ON for 1 µs and OFF for 30 µs).

Due to the small cell size, non-volatile latch circuit 300 or 400 can also be used to create a 4-input LUT (Look-Up Table) based programmable logic. Such programmable logic may also be useful in space applications since it is immune to soft errors.

The output node of the NV latch circuit 300 or 400 is low voltage (LV) since it is isolated from the HV nodes during Programming/Erasing. Therefore, this can interface to a LV buffer and LV logic devices.

As discussed above, NV latch circuit 400 needs weak PMOS devices for robustness. This can be achieved by using LV PMOS implants on a HV device (similar to HVNPASS devices on NVSRAM trigate). Preferred targets for this PMOS device could be Vt~0.75V and a Idsat ~10 µA at 1.2V.

NV latch circuits 300 and 400 as described herein use fewer transistors and smaller die area than other latch solutions, provide a low voltage output node, and need no extra masks for a P-channel NVM device. A charge pump is required, however, to provide the programming voltage at the gate of the SONOS devices.

NV latch circuits 300 and 400 can be used in space applications due to a relative immunity from soft errors since the SONOS charge is trapped in a nitride layer. This is in contrast to conventional SRAM based FPGA/LUT architectures where the SRAM charge is stored on parasitic capacitors in the circuit and hence is vulnerable to soft errors due to exposure to radiation.

Having described and illustrated the principles of exemplary embodiments, it is appreciated by those having skill in the art that those embodiments can be modified in arrangement and detail without departing from such principles. For example, while a SONOS-type tri-gate device is shown, other non-volatile devices could be used such as floating gate and F-RAM (Ferroelectric Random Access Memory) type devices could also be used. As previously discussed, power supply and programming voltages, as well as other circuit voltages, can be changed as required for a particular application. Layout pitches can also be changed as required for a particular application. We therefore claim all modifications and variation coming within the spirit and scope of the following claims.

What is claimed is:

1. A latch circuit comprising:
   a first non-volatile tri-gate device coupled between a source of supply voltage and an output node; and
   a second non-volatile tri-gate device including a first end and a second end, wherein the first end is coupled to the first non-volatile tri-gate at the output node and the second end is coupled to ground.

2. The latch circuit of claim 1 wherein the first non-volatile tri-gate device comprises a first Metal-Oxide-Semiconductor (MOS) transistor, a second MOS transistor and a third transistor including a charge-trapping nitride layer.

3. The latch circuit of claim 2 wherein the third transistor is coupled between the first and second MOS transistors, and wherein each transistor shares a common current path.

4. The latch circuit of claim 1 wherein the second non-volatile tri-gate device comprises a first MOS transistor, a second MOS transistor and a third transistor including a charge-trapping nitride layer.

5. The latch circuit of claim 1 wherein the first tri-gate device comprises two control gates and a programming gate.

6. The latch circuit of claim 4 wherein the third transistor is coupled between the first and second MOS transistors, and wherein each transistor shares a common current path.

7. The latch circuit of claim 1 wherein the second tri-gate device comprises two control gates and a programming gate.

8. A latch circuit comprising:
   a first non-volatile tri-gate device coupled between a first node and a bit line;
   a second non-volatile tri-gate device coupled between a second node and a source line; and
   a cross-coupled circuit coupled to a source of supply voltage, wherein the cross-coupled circuit is further coupled to the first non-volatile tri-gate at the first node and to the second non-volatile tri-gate at the second node.

9. The latch circuit of claim 8 wherein the first non-volatile tri-gate device comprises a first MOS transistor, a second MOS transistor and a third transistor including a charge-trapping nitride layer.

10. The latch circuit of claim 9 wherein the third transistor is coupled between the first and second MOS transistors, and wherein each transistor shares a common current path.

11. The latch circuit of claim 8 wherein the second non-volatile tri-gate device comprises a first MOS transistor, a second MOS transistor and a third transistor including a charge-trapping nitride layer.

12. The latch circuit of claim 11 wherein the third transistor is coupled between the first and second MOS transistors, and wherein each transistor shares a common current path.

13. The latch circuit of claim 8 wherein a first gate of the first tri-gate device and a first gate of the second tri-gate device are coupled together to a first control node.

14. The latch circuit of claim 13 wherein a second gate of the first tri-gate device and a second gate of the second tri-gate device are coupled together to a programming node.

15. The latch circuit of claim 14 wherein a third gate of the first tri-gate device and a third gate of the second tri-gate device are coupled together to a second control node.

16. The latch circuit of claim 8 wherein the cross-coupled circuit comprises a first and a second cross-coupled MOS transistors.

17. The latch circuit of claim 8 further comprising a buffer circuit coupled between the second node and an output node.

18. A method of operating a non-volatile latch circuit, the method comprising:
   providing a first tri-gate non-volatile device;
   providing a second tri-gate non-volatile device;
   coupling the first tri-gate non-volatile device to the second tri-gate non-volatile device, wherein the coupling of the first and second tri-gate non-volatile devices is disposed within the non-volatile latch circuit;
   erasing the first tri-gate non-volatile device;
   programming the second tri-gate non-volatile device; and
   latching an output node of the latch circuit to a logic state determined by respective thresholds of the first and second tri-gate non-volatile devices.

19. The method of claim 18 wherein the coupling the first tri-gate non-volatile device to the second tri-gate non-volatile device comprises direct coupling.

20. The method of claim 18 wherein the coupling the first tri-gate non-volatile device to the second tri-gate non-volatile device comprises indirect coupling through a cross-coupled circuit.

* * * * *